(12) United States Patent
Tepman et al.

(10) Patent No.: US 6,777,352 B2
(45) Date of Patent: Aug. 17, 2004

(54) VARIABLE FLOW DEPOSITION APPARATUS AND METHOD IN SEMICONDUCTOR SUBSTRATE PROCESSING

(75) Inventors: Avi Tepman, Cupertino, CA (US); Lawrence Chung-lai Lei, Milpitas, CA (US)

(73) Assignee: Applied Materials, Inc., Santa Clara, CA (US)

( * ) Notice: Subject to any disclaimer, the term of this patent is extended or adjusted under 35 U.S.C. 154(b) by 42 days.

(21) Appl. No.: 10/074,854

(22) Filed: Feb. 11, 2002

(65) Prior Publication Data

US 2003/0153177 A1 Aug. 14, 2003

(51) Int. Cl.[7] .................. H01L 21/31; H01L 21/469
(52) U.S. Cl. .................. 438/784; 118/696; 118/715; 118/723 VE
(58) Field of Search .................. 438/784, 656; 156/345.33; 118/728

(56) References Cited

U.S. PATENT DOCUMENTS

| | | | |
|---|---|---|---|
| 3,649,339 A | 3/1972 | Smith | |
| 4,951,601 A | 8/1990 | Maydan et al. | |
| 4,952,299 A | 8/1990 | Chrisos et al. | |
| 5,118,642 A | 6/1992 | Yoshino et al. | |
| 5,294,778 A | 3/1994 | Carman et al. | |
| 5,363,872 A | 11/1994 | Lorimer | |
| 5,582,866 A | 12/1996 | White | |
| 5,730,801 A | 3/1998 | Tepman et al. | |
| 5,865,205 A | 2/1999 | Wilmer | |
| 5,879,461 A | 3/1999 | Adams | |
| 5,944,049 A | 8/1999 | Beyer et al. | |
| 6,174,377 B1 | 1/2001 | Doering et al. | |
| 6,179,921 B1 | 1/2001 | Ruffell et al. | |
| 6,596,086 B1 * | 7/2003 | Honma et al. | 118/728 |
| 2003/0150560 A1 * | 8/2003 | Kinnard et al. | 156/345.33 |

FOREIGN PATENT DOCUMENTS

| | | |
|---|---|---|
| EP | 0370311 | 8/1994 |
| EP | 0840360 | 5/1998 |
| WO | 9734208 | 9/1997 |
| WO | 9904325 | 1/1999 |
| WO | 9920927 | 4/1999 |

* cited by examiner

*Primary Examiner*—W. David Coleman
(74) *Attorney, Agent, or Firm*—Konrad, Raynes & Victor

(57) ABSTRACT

In one embodiment of the present inventions, an exhaust outlet in a vacuum processing chamber includes a nonsealing flow restrictor which can facilitate rapid opening and closing of the flow restrictor in some applications. Because the flow restrictor is a nonsealing flow restrictor, the conductance of the flow restrictor in the closed position may not be zero. However, the flow restrictor can restrict the flow of an exhaust gas from the chamber to permit the retention of sufficient processing gas in the chamber to deposit a film on the substrate or otherwise react with the substrate. After a film has been deposited, typically in a thin atomic layer, the exhaust flow restrictor may be opened such that the flow restrictor conductance is significantly increased to a second, higher flow rate to facilitate exhausting residue gas from the chamber. The nonsealing flow restrictor may be closed again to deposit a second layer, typically of a different material onto the substrate. The nonsealing flow restrictor may be rapidly opened and closed to deposit alternating layers of a variety of materials onto the substrate.

6 Claims, 5 Drawing Sheets

US 6,777,352 B2

VARIABLE FLOW DEPOSITION APPARATUS AND METHOD IN SEMICONDUCTOR SUBSTRATE PROCESSING

FIELD OF THE INVENTIONS

These inventions relate to a novel vacuum processing chamber and method for processing substrates. More particularly, this invention relates to a vacuum processing chamber and processing method in which deposition gasses are admitted and exhausted from the chamber.

BACKGROUND OF THE INVENTIONS

Single substrate processing chambers for substrates such as silicon wafers, have been used for some time because among other reasons, the chamber volume can be minimized, contamination of the substrate can be reduced, and the process control increased such that yields can be improved. Further, vacuum systems have been developed, such as described in Maydan et al, U.S. Pat. No. 4,951,601, that allow several sequential processing steps to be carried out in a plurality of vacuum processing chambers connected to a central transfer chamber, so that several processing steps can be performed on a substrate without its leaving a vacuum environment. This can further reduce contamination of the substrates.

Other types of substrates are also processed in vacuum systems. For example, large glass substrates having active thin film transistors can be used as active matrix television and computer displays. Some glass substrates can be as large as a meter in length or longer. The basic methods and processing chambers, e.g., plasma enhanced chemical vapor deposition (PECVD), physical vapor deposition (PVD), etch chambers and the like, can be used for glass substrates in a manner similar to those used for depositing layers and patterning thin films on silicon wafers.

In conventional single substrate PECVD chambers, the substrate to be processed is typically supported by a heated susceptor and reaction gases are fed to the chamber via a gas dispersion plate mounted above and generally parallel to the substrate. The gas dispersion plate and susceptor can be connected across an RF source such that when power is turned on in the presence of a precursor gas, a plasma forms in the region between the gas dispersion plate and the substrate. Typically, the heated susceptor is movable to elevate the substrate to a desired position below the gas dispersion plate to improve the uniformity of deposition.

One deposition method provides a continuous flow of gasses through the chamber in which a first reaction gas is added to the flow, followed by a purge gas, a second reaction gas and again a purge gas. This sequence is cycled many times (typically, 25–200 cycles, depending upon the particular process) until a desired thickness is achieved. For example, one continuous flow process deposits a layer which is approximately 1 Angstrom thick each cycle and the cycle is repeated until approximately 25–200 Angstroms is deposited onto the substrate. During the deposition, the exhaust outlet of the chamber is kept substantially open to permit the continuous flow of the gas mixtures through the chamber.

Materials deposited in such continuous processes include tungsten, titanium, titanium chloride, and other materials which are suitable to be vaporized or evaporated and injected into a stream. In some deposition processes such as atomic layer deposition (ALD), each deposition gas is injected into the chamber in a relatively short pulse during each of the deposition cycles. For example, a deposition gas injection pulse may be on the order of a half second or less.

Another deposition method introduces a deposition gas into the chamber in which the exhaust outlet is sealed so that relatively high pressures of the deposition gas may be achieved in the chamber. This deposition method is considered to be noncontinuous in that the chamber admits a quantity of reaction gas and holds it until the desired deposition thickness has been achieved. The chamber exhaust outlet is then unsealed and opened and the deposition gas is purged from the chamber. The exhaust outlet valves tend to be relatively slow to open because the seals may need to decompress or may otherwise delay the opening of the outlet valve. Materials deposited in such non-continuous depositions include aluminum, for example, which may be deposited in a chamber atmosphere of several thousand p.s.i.

By manipulation of gas flows, temperatures, and pressure in the chamber maintained by a vacuum exhaust system, most of the particulates in the plasma region can be carried by the gases away from the susceptor and substrate and to the exhaust system. U.S. Pat. No. 5,582,866, which is assigned to the assignee of the present application, discloses a vacuum exhaust system which includes a plenum chamber connected to an exhaust port and vacuum pump. The plenum chamber is built into the lid so as to completely surround the gas dispersion plate and be above and surrounding the substrate periphery. A non-sealing, pressure-controlling throttle valve coupled to the exhaust port can control the flow of material from the chamber through the pump.

SUMMARY OF THE INVENTIONS

In one embodiment of the present inventions, an exhaust outlet in a vacuum processing chamber includes a nonsealing flow restrictor which can facilitate rapid opening and closing of the flow restrictor in some applications. Such a flow restrictor may be used in a variety of different chambers and deposition methods. It is believed that a nonsealing flow restrictor in accordance with the present invention is well suited to fast cycle deposition sequences such as atomic layer depositions (ALD).

Because the flow restrictor is a nonsealing flow restrictor, the conductance of the flow restrictor in the closed position may not be zero. However, the flow restrictor can restrict the flow of an exhaust gas from the chamber to permit the retention of sufficient processing gas in the chamber to deposit a film on the substrate or otherwise react with the substrate. In a preferred embodiment, the flow restrictor is a near sealing flow restrictor. After the desired film has been deposited or the processing of the substrate has been completed, the exhaust flow restrictor may be opened such that the flow restrictor conductance is significantly increased to a second, higher flow rate to facilitate exhausting residue gas from the chamber.

The closing and opening of the exhaust flow restrictor may be repeated as many times as needed to deposit additional layers onto the substrate until the desired thickness is achieved. In one embodiment, an atomic layer is deposited each cycle of the closing and opening of the exhaust flow restrictor. It is contemplated that different deposition materials may be alternately deposited as the deposition builds up onto the substrate.

A vacuum processing chamber in accordance with one embodiment comprises a plenum chamber coupled to an exhaust port and vacuum pump, in which plenum chamber is built into or adjacent to the lid so as to completely surround the substrate periphery. The near sealing exhaust flow restrictor when open couples the plenum chamber to the plasma processing region above the substrate. The near sealing exhaust flow restrictor, like the plenum, also surrounds the substrate. The flow restrictor passageway or passageways may be positioned around the substrate such that spent gases and particulates may be withdrawn from the plasma processing region in a desired fashion.

There are additional aspects to the present inventions. It should therefore be understood that the preceding is merely a brief summary of some embodiments and aspects of the present inventions. Additional embodiments and aspects of the present inventions are referenced below. It should further be understood that numerous changes to the disclosed embodiments can be made without departing from the spirit or scope of the inventions. The preceding summary therefore is not meant to limit the scope of the inventions. Rather, the scope of the inventions is to be determined by appended claims and their equivalents.

DETAILED DESCRIPTIONS OF EXEMPLARY EMBODIMENTS

Figure 1:
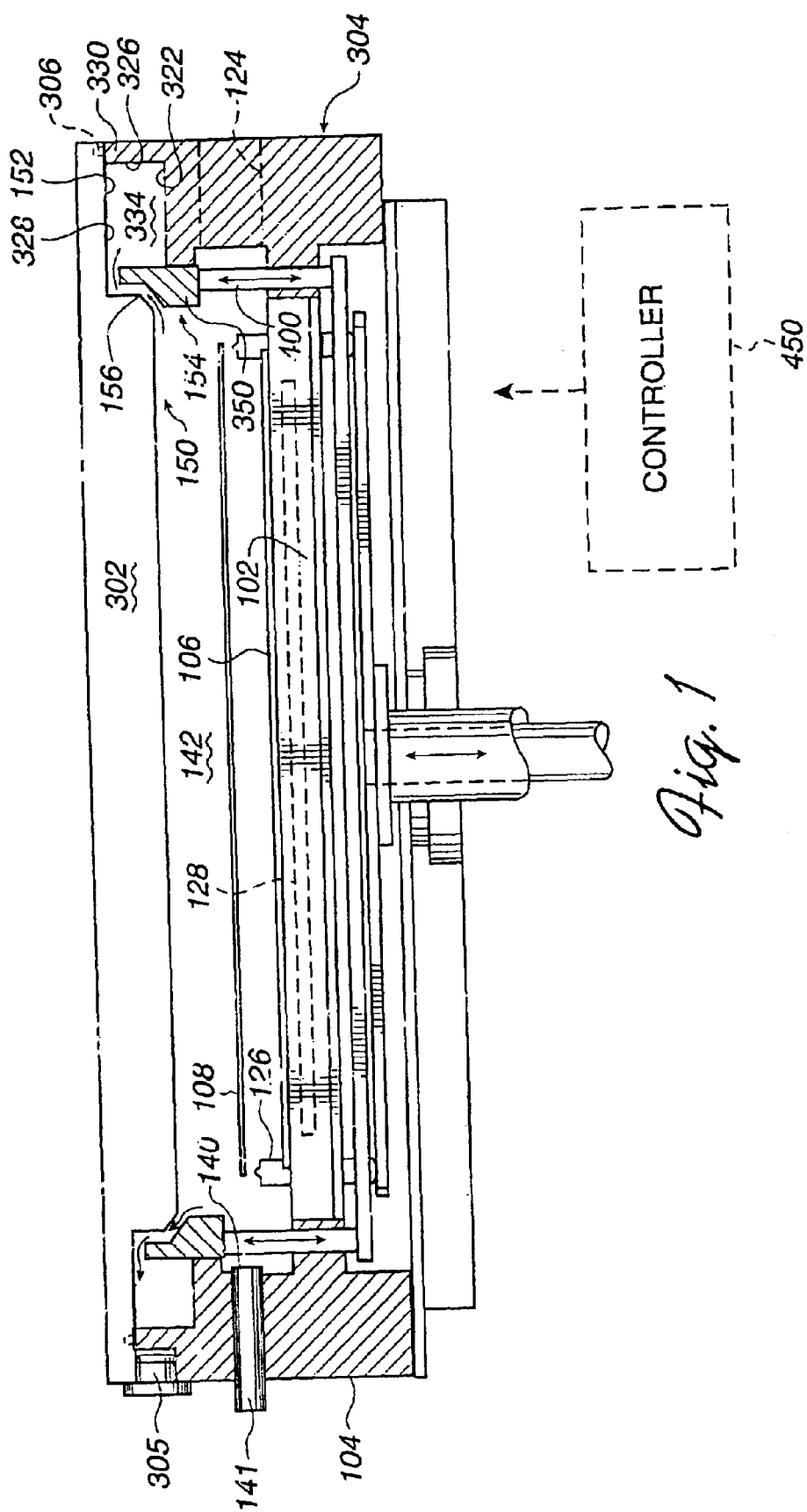
FIG. 1 is a cross sectional view of a single substrate ALD chamber in accordance with aspects of the present inventions.

A processing chamber in accordance with a preferred embodiment of various aspects of the present inventions is indicated generally at 100 in FIG. 1. The processing chamber 100 includes a substrate support 102 having a support surface 106 which supports a substrate 108 in position for deposition of a layer of deposition material. The substrate 108 may be a silicon wafer, for example, or a glass substrate or other substrates upon which a layer of material may be deposited. Although the illustrative chamber 100 is depicted as a single substrate chamber, it is appreciated that the present inventions may be used in connection with multiple substrate chambers as well.

Figures 2, 2A, 2B:
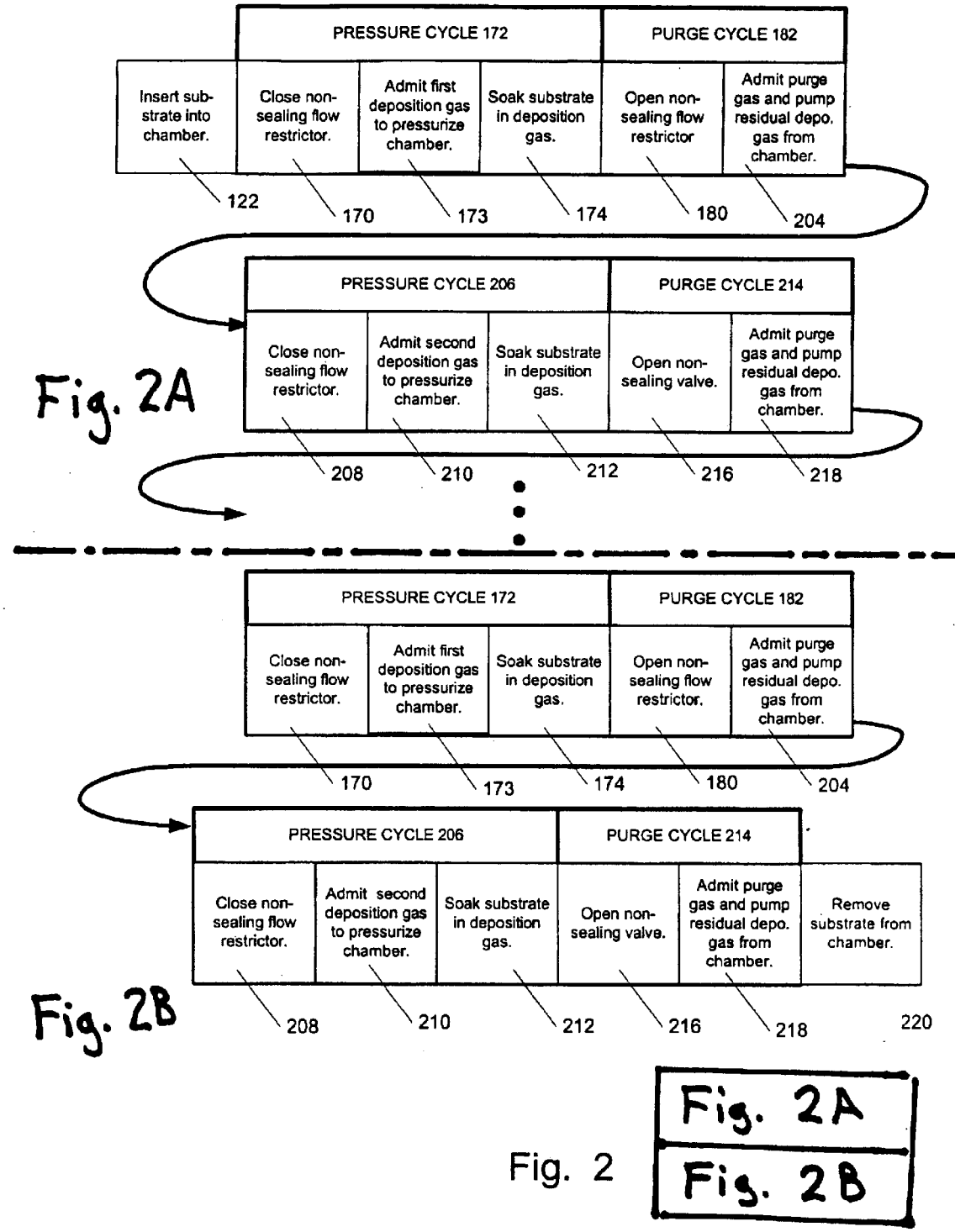
FIGS. 2A and 2B form a schematic chart (as indicated in FIG. 2) illustrating a process in accordance with aspects of the present inventions using the chamber of FIG. 1.

FIGS. 2A and 2B illustrate in schematic form a typical process 120 for depositing material on to a substrate such as the substrate 108 using the chamber 100. As explained in greater detail below, the present inventions have particular applicability to deposition processes such as atomic layer depositions in which many very thin layers are deposited in rapid succession onto the substrate. As indicated generally at 122, a typical process is initiated by admitting a substrate into the chamber though a slit valve or other suitable substrate port 124 (FIG. 1) and onto the support surface 106 for processing. A heater 128 may be provided within the substrate support 102 to heat the substrate 108, depending upon the particular deposition process.

The deposition material is preferably admitted into the chamber 100 in the form of a deposition gas through one or more suitable chamber inlets such as the gas inlet 140. The flow of deposition material from each inlet into the chamber is controlled by a suitable inlet flow control valve 141 which may include sealing and non-sealing devices. Following deposition of a layer, a certain amount of residue gasses typically remain in the chamber. These residue gasses can include undeposited gasses as well as reaction byproducts in gas or particulate form suspended within the chamber gasses. The residue gasses are usually preferably removed from the chamber prior to admitting additional deposition gas to deposit the next layer. In accordance with one aspect of the present inventions, the chamber 100 has an exhaust outlet 150 which can facilitate rapid substrate processing and inhibit particle generation. In the illustrated embodiment, the exhaust outlet 150 includes an exhaust passageway 152 and an exhaust flow restrictor 154 which, in the open position (FIG. 1), defines a flow restrictor passageway 156 which couples the chamber processing area 142 above the substrate to the exhaust outlet passageway 152 to exhaust the residue gasses from the chamber.

In a preferred embodiment, the exhaust flow restrictor 154 is a non-sealing flow restrictor such that in the closed position (FIG. 3), it is anticipated that the flow restrictor passageway 156 may not be entirely closed. It has been recognized by the present applicants that for some non-continuous deposition processes, satisfactory results may be achieved without a complete sealing of the exhaust outlet of the chamber during the deposition. Moreover, by eliminating or reducing sealing elements such as seal rings and the like from the exhaust flow restrictor 154, it is believed that the exhaust flow restrictor 154 may be operated more quickly and the generation of particles reduced.

For example, prior to admitting or during the admission of deposition gas, the exhaust flow restrictor 154 may be closed (step 170 of FIGS. 2A and 2B) to facilitate achieving an adequate deposition gas pressurization level in the chamber during the deposition process. As indicated at 172 in FIGS. 2A and 2B, the closing of the exhaust flow restrictor 154 initiates a "pressure cycle" in which the pressure of the chamber is increased for deposition. Thus, following closing of the exhaust flow restrictor 154 a processing gas such as a deposition gas is admitted (or continued to be admitted) into the chamber through the gas inlet 140 as represented by step 173 in the process of FIGS. 2A and 2B. Because the flow restrictor 154 is closed, the pressure in the chamber will rise. However, because the exhaust flow restrictor 154 in the embodiment of FIG. 1 is not a sealing type flow restrictor, it is anticipated that some deposition gas may escape through the closed flow restrictor 154 during the deposition process. However, as long as the flow rate through the closed flow restrictor 154 is less than the flow rate through the inlet flow valve 141, it is believed that the pressure in the chamber can rise to the desired level notwithstanding leakage through the exhaust flow restrictor 154. In a preferred embodiment, the flow rate through the closed flow restrictor is within a range of 0–100 sccm (standard cubic centimeter per minute) at a pressure in the range of 10 Torr to 300 Torr. Thus, the flow restrictor can be a near sealing flow restrictor which has a relatively low flow rate in the "closed" position.

Once the desired pressure level has been achieved, the flow valve of the deposition gas inlet 140 may be closed. For some deposition processes, it may be desirable to permit the substrate 108 to soak in the deposition gas atmosphere (step 174, FIGS. 2A and 2B) in the interior of the chamber for a length of time following the closing of the gas inlet to ensure an adequate deposition thickness. To ensure adequate deposition gas pressure during the soaking period, the deposition gas pressure may be raised prior to closing the gas inlet to a level which would accommodate some leakage through the exhaust flow restrictor during the soaking period. In one embodiment, the pressure may rise to a level of 300 Torr, for example. Thus, although the deposition gas pressure may fall somewhat during the soaking period because of some leakage through the nonsealing exhaust flow restrictor, the deposition gas pressure at the end of the soaking period may still be sufficiently high to ensure a satisfactory deposition. In a preferred embodiment, the deposition gas pressure for a typical deposition gas may fall to a level in a range of 5–30 Torr.

The duration of the pressure cycle will be dependent to a large extent upon the material selected, the desired layer thickness and the deposition pressure. For many processes, it is believed that a pressure cycle of less than 10 seconds in duration will be suitable for many deposition materials. Because the duration of each pressure cycle is typically relatively short, relatively little deposition gas will escape through the near sealing flow restrictor during each pressure cycle.

Once the substrate has soaked in the deposition gas for a sufficient length of time to deposit the desired thickness of deposition material, the pressure cycle 172 may be ended by opening the exhaust flow restrictor 154 (step 180, FIGS. 2A and 2B) as shown in FIG. 1 to permit the residue gasses to be readily exhausted from the chamber interior during a "purge Cycle" as indicated at 182 in FIGS. 2A and 2B. In this open position, the exhaust flow restrictor 154 preferably has sufficient conductance to permit rapid exhaustion of the residue gasses. In a preferred embodiment, the non-sealing flow restrictor 154 has a conductance in the range of 10–20 slm (standard liter per minute) in the open position. By comparison, the conductance of the near sealing flow restrictor 154 in the closed position illustrated in FIGS. 2A and 2B is preferably much smaller and is preferably close to zero but it is anticipated that the conductance will be somewhat greater than zero because the flow restrictor is a non-sealing flow restrictor. In a preferred embodiment, the near sealing flow restrictor 154 has a conductance in the range of 0–100 scorn in the closed position.

Figure 4:
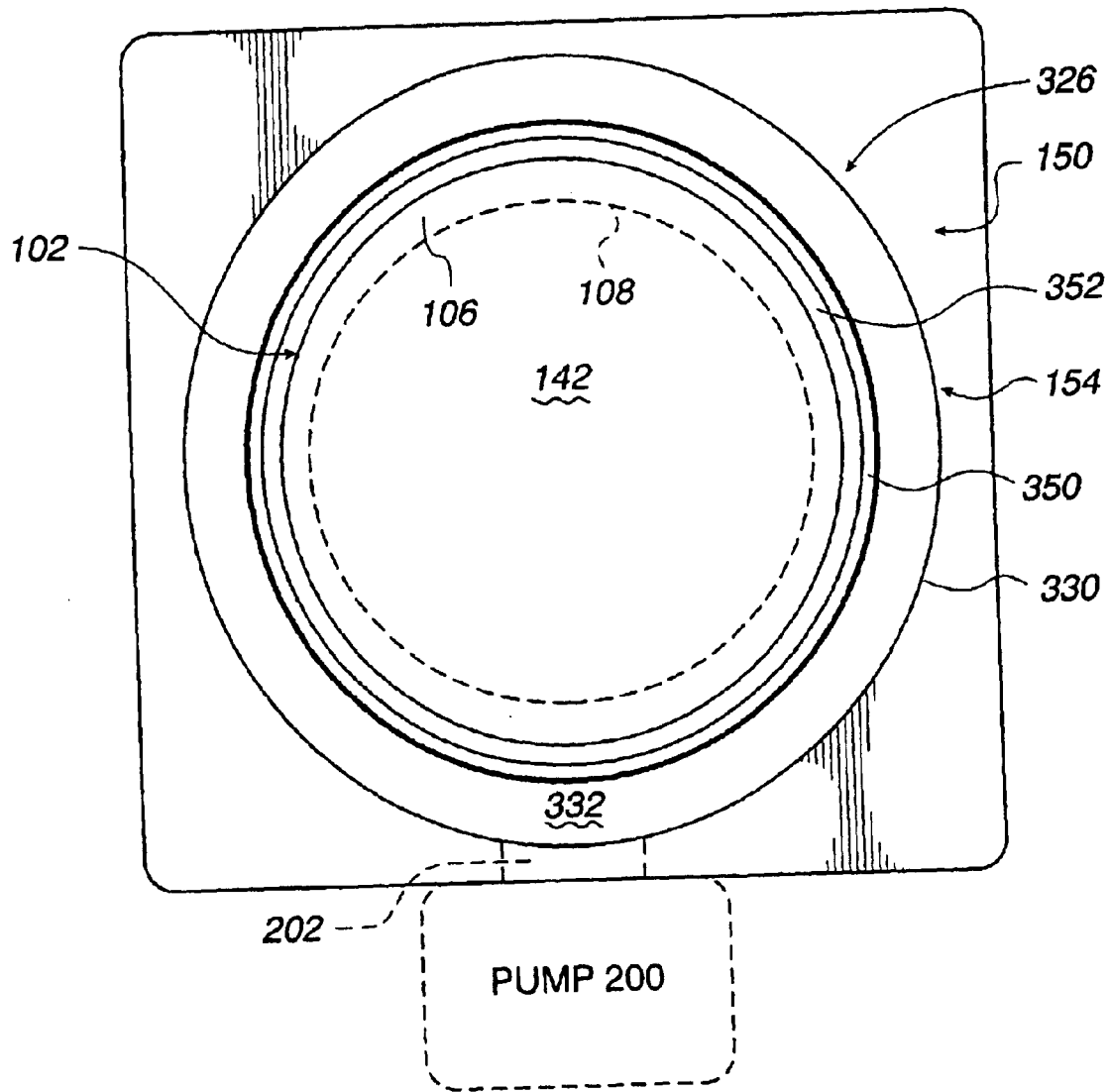
FIG. 4 is a schematic view of the chamber body top of FIG. 1.

To facilitate exhausting the residue gasses from the chamber, a pump 200 may be coupled to an outlet port 202 of the exhaust outlet 150 as shown in FIG. 4. In addition one or more purge gasses may be admitted into the chamber as indicated in step 204 (FIGS. 2A and 2B), to drive the residue gas from the chamber interior as the pump 200 pumps the gasses through the exhaust flow restrictor 154, through the exhaust passageway 152 and out of the chamber through the outlet port 202. Once the chamber has been sufficiently purged, a different reactant or deposition gas may be admitted to deposit another thin layer.

In the process of FIGS. 2A and 2B, there is a plurality of pressure cycles 172, each followed by a purge cycle 182, to sequentially deposit a plurality of layers onto a substrate before the substrate is removed from the chamber. In each pressure cycle 172, the non-sealing flow restrictor 154 is closed and a process gas such as a deposition gas is admitted. After a layer has been deposited, the non-sealing flow restrictor is opened and residue gasses are discharged in the subsequent purge cycle 182. The process gas or gasses may be the same in each pressure cycle or may change, depending upon the desired process.

In the embodiment of FIGS. 2A and 2B, a first reactant gas is admitted in the gas admission step 173 of the first pressure cycle 172. After the subsequent purge cycle 182, a pressure cycle 206 follows which is similar to the pressure cycle 172 except that following the closing of the exhaust flow restrictor (step 208) a second, different reactant gas is admitted in an admission step 210 of this next pressure cycle 206. During the pressure cycle 206, the second reactant is deposited onto or otherwise reacts with the first reactant deposited in the prior pressure cycle 172 (step 212) to form another thin layer on the substrate. Examples of deposition materials in a second pressure cycle include nitrogen, oxygen or silicon which can react with the previously deposited material to form a nitride, oxide or silicide, respectively.

Following each pressure cycle 206, a purge cycle 214 similar to the purge cycle 182, opens the non-sealing exhaust flow restrictor 154 (step 216) to purge the undeposited second reactant from the chamber using a purge gas (step 218). The pressure cycles 172 and 206 alternate in this manner, depositing alternating layers of the first and second reactants, each pressure cycle being followed by an associated purge cycle 182, 214, until the desired film thickness has been deposited (or the film processing is otherwise complete). After the final purge cycle 214, the slit valve 124 is opened and the substrate is removed from the chamber as shown in step 220 of FIGS. 2A and 2B. Because of the rapid opening and closing capabilities of the flow restrictor 154, it is believed that the combined total of the pressure cycle and the purge cycle may be in a range of 5–20 seconds and more typically 10 seconds for many applications. However, the exhaust flow restrictor is suitable for substantially shorter cycles of 0.5 seconds or less, depending upon the application. Other pressure cycles may be 5 seconds or 3 seconds or less, depending upon the application.

In the illustrated embodiment, the chamber 100 includes two principal parts, a lid portion 302 (see FIG. 1) and a processing chamber body portion 304. The two parts 302, 304 are attached by means of a hinge 305. A vacuum pressure is maintained in the chamber when the lid is closed by means of one or more O-ring seals 306. In this manner, a pressure vessel may be formed by the joining of the two parts.

The exhaust outlet 150 includes a plenum chamber 326 which is formed when the lid portion 302 is closed onto the chamber body portion 304. The plenum chamber 326 has a top wall 328 (FIG. 1) provided by the lid portion 302 and an outer side 330 (FIG. 4) and a bottom wall 332 provided by the chamber walls of the body portion 304. The plenum chamber 326 defines an interior 334 (FIG. 1) which is generally annular shaped (FIG. 4) and completely surrounds the processing region 142 above the substrate support 102. The annular plenum may be circular shaped, rectangular shaped or have another shape, depending upon the shape of the chamber and the shape of the substrate being processed.

The outlet flow restrictor 154 controls the rate at which gasses are exhausted from the processing region into the plenum chamber interior to be exhausted out through the chamber exhaust port 202. A throttle may be coupled between the exhaust port 202 and the pump 200 to further regulate the flow of material from the plenum chamber 326. An isolation valve coupled to the exhaust port 202 can facilitate a unidirectional gas flow.

Figure 3:
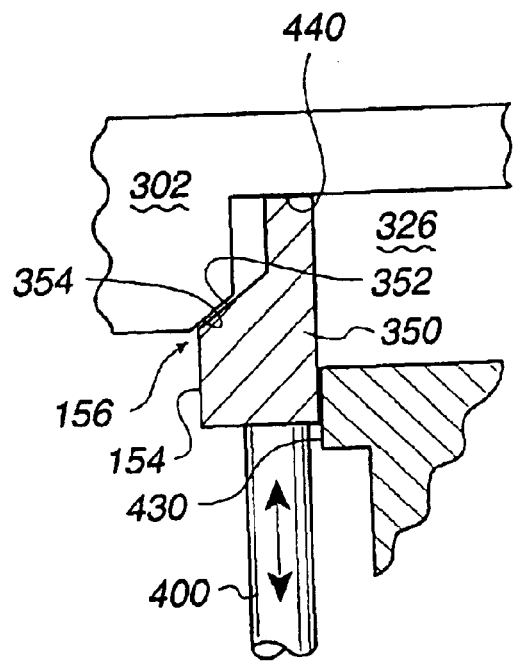
FIG. 3 is an enlarged view of the nonsealing flow restrictor of FIG. 1.

The outlet flow restrictor 154 includes a movable flow restrictor body 350 which, in the illustrated embodiment moves between an open position as shown in FIG. 1 and a closed position as depicted in FIG. 3. The flow restrictor body 350 is also generally annular shaped and defines an annular shaped flow restrictor engagement surface 352 which engages an opposing annular-shaped flow restrictor seat surface 354 disposed on the lid portion 302 when the flow restrictor is in the closed position as shown in FIG. 3. The flow restrictor passageway 156 is defined by the annular space between the flow restrictor engagement surface 352 and the flow restrictor seat surface 354, each of which completely surrounds the processing region 142 above the substrate support 102. Thus when the flow restrictor 154 is open, the flow restrictor passageway 156 provides a narrow, uniform gap for exhaustion of gases in which the gap is present around the whole periphery of the substrate. Alternatively, the gap 156 of the flow restrictor can also be formed by a series of openings placed uniformly around the periphery of the substrate.

It is recognized that the flow restrictor opening or openings 156 can be shaped and positioned as desired to achieve the desired flow patterns from the chamber. For example, the flow restrictor including the flow restrictor body and seat may be circular shaped as shown in FIG. 4, rectangular shaped or have another shape, depending upon the shape of the chamber and the shape of the substrate being processed. In addition, the flow restrictor passageways 156 can be positioned to provide an exhaust flow which can offset an imbalance that might be caused by vacuum pumping from only one side of the substrate and plenum chamber. As a result, more uniform exhaust around the whole periphery of the substrate might be achieved, even at high gas pressures.

It is further recognized that the flow restrictor may have a single body formed of a single member such as the illustrated body 350. Alternatively the flow restrictor can have a plurality of flow restrictor bodies disposed around the chamber as needed. In a preferred embodiment, the flow restrictor body or bodies and the flow restrictor passageway or passageways are disposed on at least two sides of the substrate to draw exhaust gasses more uniformly from the chamber as compared to an exhaust outlet disposed on just one side of the substrate.

The walls of the chamber body 304 may be shaped to form a continuous and smoothly tapering flow path for the exhaust gas to reach the passageway 156, which may further reduce the accumulation of particles in the chamber body 304 and the exhaust passageway 152. Because the plenum chamber 326 is generally large with respect to the flow restrictor passageway 156, and is open around its whole circumference via exhaust passageway 152, it is believed that good and uniform evacuation from the whole of the plasma/processing region 142 may be facilitated.

In the illustrated embodiment, the heater 128 is affixed to the substrate support 106 which in turn is affixed to the walls 104 of the chamber. Hence, the heater 128 and the substrate support 106 in the illustrated embodiment do not move. It is appreciated that in other applications, a movable heater and substrate support may be desirable. However, in those applications in which the heater and substrate support are fixed and do not move, the chamber interior may be made more compact. As a consequence, the chamber may be filled with processing gas and the residue gasses evacuated from the chamber more quickly.

The exhaust flow restrictor body 350 may be actuated between open and closed positions using any suitable actuator, depending upon the particular application. For example, in the chamber 100 of the illustrated embodiment, the flow restrictor body 350 is actuated by a plurality of push rods 400 (FIG. 1) which extend below the level of the substrate support surface 106. The flow restrictor body 350 may slide against a chamber wall surface 430 (FIG. 3) to direct the movement of the flow restrictor body. In addition, the flow restrictor body 350 may engage more than one flow restrictor seat surface as indicated by the secondary flow restrictor seat surface 440 in FIG. 3.

The movements of the push rods (and the associated flow restrictor body 350) may be controlled by one or more controllers represented schematically by a controller 450 in FIG. 1. Other components including the gas inlet 140, substrate port 124 and heater 128 may be controlled by the controller 450 as well. The controller 450 may be implemented, for example, by a programmed workstation. It is contemplated that hardwired controllers may be used as well.

In the embodiment of FIG. 1, the substrate support 102 has an outer periphery and the flow restrictor body 350 has an inner periphery. To reduce the chances of particulates falling on the substrate, it is preferred if the flow restrictor body inner periphery is positioned entirely outside the substrate support outer periphery as shown in FIG. 4.

Figure 6:
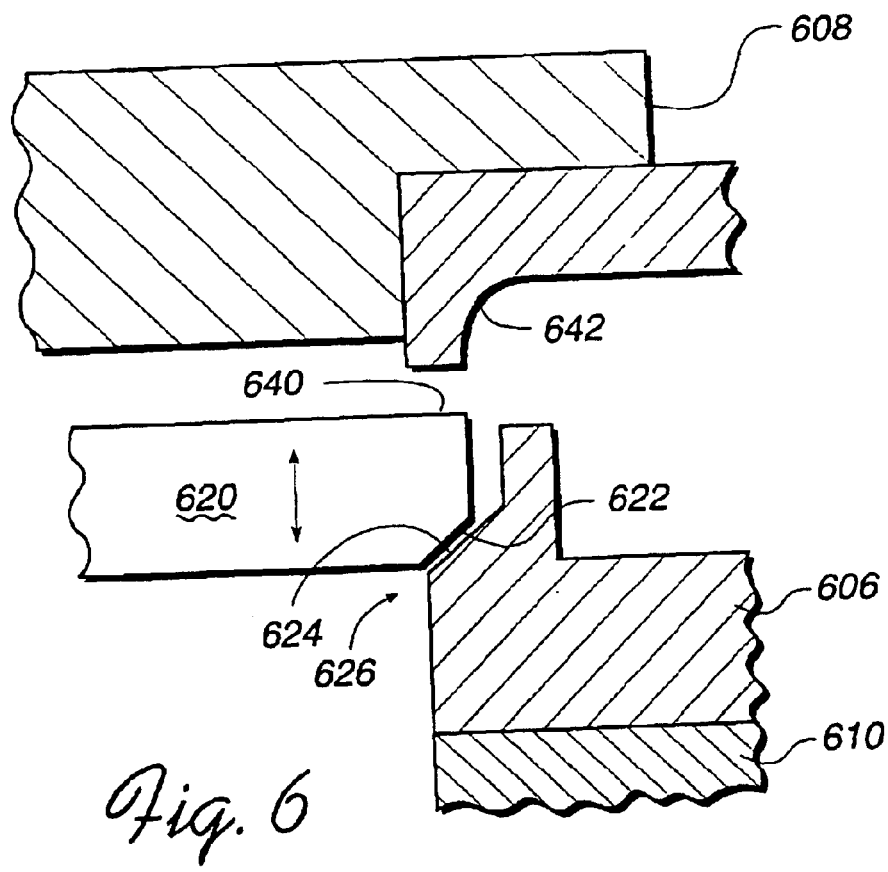
FIG. 6 is an enlarged view of the nonsealing flow restrictor of FIG. 5.
Figure 5:
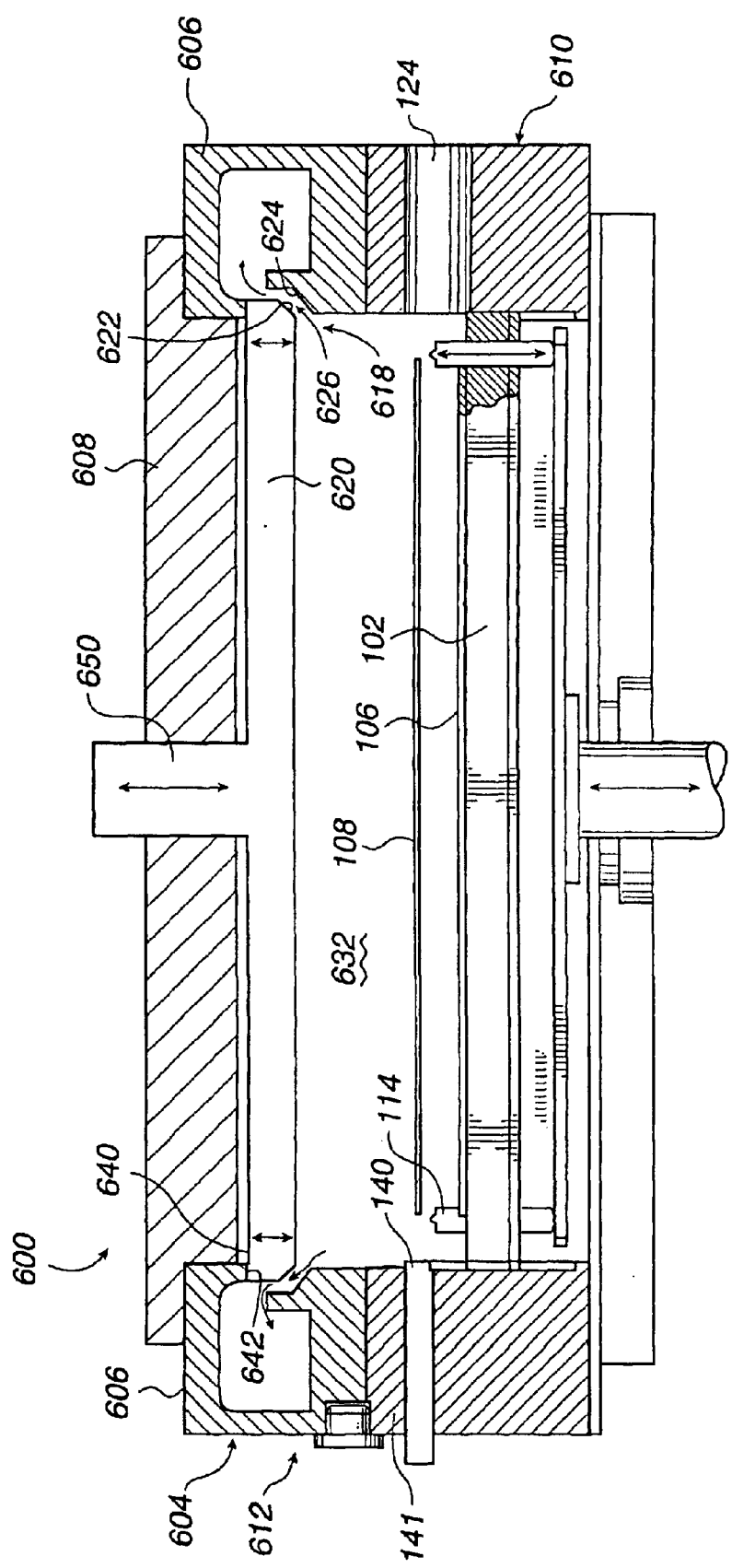
FIG. 5 is a cross sectional view of a single substrate ALD chamber in accordance with an alternative embodiment.

In the embodiment illustrated in FIG. 1, the exhaust plenum 326 is formed between the underside of the lid 302 and upper walls of the chamber body portion 304. Alternatively, the exhaust plenum may be formed entirely in the body portion or entirely in the lid portion, depending upon the particular application. FIGS. 5 and 6 show an alternative chamber embodiment 600 in which a lid portion 604 includes an exhaust plenum chamber 606 and a central cover 608. The lid portion 604 is pivotally coupled to the chamber body portion 610 by a hinge 612. A pressure vessel is formed when the lid portion 604 is closed onto the body portion 610 in a manner similar to that of the chamber 100 of FIG. 1.

The chamber 600 also includes a non-sealing flow restrictor 618 which has a movable body 620 which moves between an open position as depicted in FIG. 5 and a closed position as depicted in FIG. 6. The flow restrictor body 620 is generally disk-shaped and defines an annular shaped flow restrictor engagement surface 622 which engages an opposing annular-shaped flow restrictor seat surface 624 disposed on the plenum chamber when the flow restrictor is in the closed position as shown in FIG. 6. A flow restrictor passageway 626 is defined by the space between the flow restrictor engagement surface 622 and the flow restrictor seat surface 624, each of which completely surrounds the processing region 632 above the substrate support 102. Thus when the flow restrictor 618 is open, the flow restrictor passageway 626 provides a narrow, uniform gap for exhaustion of gases in which the gap is present around the whole periphery of the substrate. Alternatively, the gap 626 of the flow restrictor opening can also be formed by a series of openings placed uniformly or as desired around the periphery of the substrate. In the open position, the upper side 640 of the flow restrictor body 620 engages a second annular-shaped flow restrictor seat surface 642 disposed on the plenum chamber to inhibit the passage of exhaust gasses between the flow restrictor body 620 and the lid central cover 608.

In the embodiment, of FIG. 5, the flow restrictor body 620 is actuated by a central push rod 650 which is journaled for vertical movement in the lid central cover 608. Movement of the push rod 650 actuates the flow restrictor body 620 between the open and closed positions. In some applications it is not desirable for moving parts to be positioned above the substrate due to the increased risk of particles being generated over the substrate. However, in other applications the benefits of such a design may outweigh the increased risks.

In the illustrated embodiment, the substrate 108 is lowered to and lifted from the substrate support surface 106 by lift fingers 126. In this embodiment, the movable bodies of the flow restrictors together with the lift fingers 126 are selectively actuated by push rods journaled for vertical movement in the chamber wall. Pressure-tight seals may be provided around the rods to maintain the vacuum pressure of the pressure vessel.

A process in accordance with the present inventions may be used to deposit a variety of deposition materials to form a variety of deposited materials. The deposition gas may include one or more different gasses which deposit material onto the substrate. The gasses may react chemically prior to deposition or may react with material previously deposited onto the substrate. Other deposited materials may be deposited in a relatively pure form. Examples of suitable deposition materials are believed to include tantalum, tantalum nitride, tantalum oxide, titanium, titanium nitride, tungsten, tungsten silicide, silicon nitride, and aluminum oxide. Although the processes of the illustrated embodiment have been described primarily in connection with deposition gasses, it is recognized that a chamber in accordance with the present inventions may be used with other processing gasses including gasses which react with the substrate but do not deposit a significant amount of material onto the substrate.

The chamber 100 may also have a plasma generator to generate a plasma to activate the deposition gas or other processing gas. Heating the substrate with the heater 128 can in some processes, accelerate the deposition process and also cause the deposition material to deposit preferentially onto the substrate rather than other interior surfaces of the chamber. In addition, in some applications, a dispersal plate may be used to distribute the deposition gas. Dispersal plates are often used to promote uniformity, particularly in low quantity, fast depositions. Alternatively, a dispersal plate may be omitted, particularly in relatively long deposition processes in which the substrate is permitted to soak in a large quantity of the deposition gas.

It will, of course, be understood that modifications of the illustrated embodiments, in their various aspects, will be apparent to those skilled in the art, some being apparent only after study, others being matters of routine mechanical and electronic design. Other embodiments are also possible, their specific designs depending upon the particular application. As such, the scope of the invention should not be limited by the particular embodiments described herein but should be defined by the appended claims and equivalents thereof.

What is claimed is:

1. A method of depositing deposition materials onto a substrate in a vacuum chamber, comprising:

in a first cycle, closing a non-sealing circular flow restrictor surrounding the substrate wherein the flow restrictor couples the interior of the chamber to an exhaust port of the chamber and admitting a first deposition gas into the chamber to react with a substrate in the chamber while the flow restrictor is closed wherein the closed flow restrictor limits the exhaustion of the first deposition gas through the exhaust flow restrictor to the exhaust port to facilitate depositing a first deposition material onto the substrate;

in a second cycle, opening the flow restrictor and purging the chamber of the first deposition gas while the flow restrictor is open;

in a third cycle, closing the flow restrictor and admitting a second deposition gas into the chamber to react with the substrate in the chamber while the flow restrictor is closed wherein the closed flow restrictor limits the exhaustion of the second deposition gas through the exhaust flow restrictor to the exhaust port to facilitate depositing a second deposition material onto the substrate;

in a fourth cycle, opening the flow restrictor and purging the chamber of the second deposition gas while the flow restrictor is open; and repeating the above cycles thereby repeatedly and alternately closing and opening the flow restrictor and alternately depositing the first and second materials while the flow restrictor is closed, and alternately purging the first and second deposition gasses while the flow restrictor is open.

2. The method of claim 1 wherein said deposition materials form a plurality of layers on the substrate, said layers including one or more materials selected from the group of tantalum, tantalum nitride, tantalum oxide, titanium, titanium nitride, tungsten, tungsten suicide, silicon nitride, and aluminum oxide.

3. The method of claim 1 wherein an atomic layer is deposited in each of said first and third cycles.

4. The method of claim 1 wherein each cycle is less than 10 seconds in duration.

5. The method of claim 4 wherein each cycle is less than 0.5 seconds in duration.

6. The method of claim 4 wherein closing the flow restrictor includes seating a circular annular valve body surrounding the substrate against a circular annular valve seat surrounding the substrate and positioned on a lid of the chamber.

* * * * *